United States Patent
Bedell et al.

(10) Patent No.: US 8,685,804 B2
(45) Date of Patent: Apr. 1, 2014

(54) ENHANCEMENT OF CHARGE CARRIER MOBILITY IN TRANSISTORS

(75) Inventors: Stephen W. Bedell, Wappingers Falls, NY (US); Kangguo Cheng, Schenectady, NY (US); Ali Khakifirooz, Mountain View, CA (US); Pranita Kulkarni, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 60 days.

(21) Appl. No.: 13/251,783

(22) Filed: Oct. 3, 2011

(65) Prior Publication Data
US 2013/0082328 A1    Apr. 4, 2013

(51) Int. Cl.
*H01L 21/84* (2006.01)

(52) U.S. Cl.
USPC .......................................... 438/151

(58) Field of Classification Search
USPC .................... 257/19, 55, 190, 192, 213, 219; 438/285, 197, 300, 199, 172, 187, 229
See application file for complete search history.

(56) References Cited

U.S. PATENT DOCUMENTS

| | | | |
|---|---|---|---|
| 6,911,379 B2 | 6/2005 | Yeo et al. | |
| 7,098,508 B2 | 8/2006 | Ieong et al. | |
| 7,226,824 B2 | 6/2007 | Weber et al. | |
| 7,632,745 B2 | 12/2009 | Chen | |
| 7,763,505 B2 | 7/2010 | Gehring et al. | |
| 7,812,397 B2 | 10/2010 | Cheng et al. | |
| 2003/0113948 A1* | 6/2003 | Fitzgerald | 438/37 |
| 2007/0054467 A1 | 3/2007 | Currie et al. | |
| 2008/0179636 A1 | 7/2008 | Chidambarrao et al. | |
| 2008/0210976 A1* | 9/2008 | Liu | 257/190 |
| 2009/0134460 A1* | 5/2009 | Adam et al. | 257/347 |
| 2009/0236595 A1 | 9/2009 | Atanackovic | |
| 2011/0169084 A1 | 7/2011 | Yang et al. | |
| 2012/0104474 A1* | 5/2012 | Yin et al. | 257/288 |

OTHER PUBLICATIONS

Cheng, K., et al. "Fully Depleted Extremely Thin SOI Technology Fabricated by a Novel Integration Scheme Featuring Implant-Free, Zero-Silicon-Loss, and Faceted Raised Source/Drain" 2009 Symposium on VLSI Technology Digest of Technical Papers. Jun. 2009 pp. 212-213.

Khakifirooz, A., et al. "Fully Depleted Extremely Thin SOI for Mainstream 20NM Low-Power Technology and Beyond" 2010 IEEE International Solid-State Circuits Conference. Feb. 2010. pp. 152-153.

(Continued)

*Primary Examiner* — Julio J Maldonado
*Assistant Examiner* — Moin Rahman
(74) *Attorney, Agent, or Firm* — Tutunjian & Bitetto, P.C.; Vazken Alexanian

(57) ABSTRACT

Transistor devices including stressors are disclosed. One such transistor device includes a channel region, a dielectric layer and a semiconductor substrate. The channel region is configured to provide a conductive channel between a source region and a drain region. In addition, the dielectric layer is below the channel region and is configured to electrically insulate the channel region. Further, the semiconductor substrate, which is below the channel region and below the dielectric layer, includes dislocation defects at a top surface of the semiconductor substrate, where the dislocation defects are collectively oriented to impose a compressive strain on the channel region such that charge carrier mobility is enhanced in the channel region.

6 Claims, 5 Drawing Sheets

(56) References Cited

OTHER PUBLICATIONS

Mubarek, H., et al. "Flourine-Vacancy Engineering: A Viable Solution for Dopant Diffusion Suppression in SOI Substrates" Nanoscaled Semiconductor on Insulator Structures and Devices. 2007. pp. 73-87.

Non-Final Office Action issued on Nov. 15, 2012 in U.S. Appl. No. 13/610,456.
Non-Final Office Action issued on Jun. 5, 2013 in U.S. Appl. No. 13/610,456.

* cited by examiner

ENHANCEMENT OF CHARGE CARRIER MOBILITY IN TRANSISTORS

BACKGROUND

1. Technical Field

The present invention relates to semiconductor devices, and, more particularly, to stressor elements within such devices.

2. Description of the Related Art

Enhancement of charge carrier mobility is an important aspect of the development of transistor device technology. One means of improving charge carrier mobility is the introduction of stresses in the device. For example, the introduction of a tensile stresses can improve electron mobility in NFET (n-type field effect transistor) devices while the introduction of compressive stresses can improve hole mobility in PFET (p-type field effect transistor) devices. To provide such stresses, transistors can be fabricated to have source and drain regions that are composed of different lattice structures than that of a substrate. Here, the source and drain regions can be epitaxially grown to form the disparate lattice structures and thereby obtain the desired stresses.

SUMMARY

One embodiment is directed to a transistor device that includes a channel region, a dielectric layer and a semiconductor substrate. The channel region is configured to provide a conductive channel between a source region and a drain region. In addition, the dielectric layer is below the channel region and is configured to electrically insulate the channel region. Further, the semiconductor substrate, which is below the channel region and below the dielectric layer, includes dislocation defects at a top surface of the semiconductor substrate, where the dislocation defects are collectively oriented to impose a compressive strain on the channel region such that charge carrier mobility is enhanced in the channel region.

An alternative embodiment is directed to a circuit apparatus that includes a plurality of transistor devices. Each transistor device includes a channel region, a dielectric layer and a semiconductor substrate. The channel region is configured to provide a conductive channel between a source region and a drain region. In addition, the dielectric layer is below the channel region and is configured to electrically insulate the channel region. Further, the semiconductor substrate, which is below the channel region and below the dielectric layer, includes dislocation defects at a top surface of the semiconductor substrate, where the dislocation defects are collectively oriented to impose a compressive strain on the channel region such that charge carrier mobility is enhanced in the channel region.

Another embodiment is directed to a method for forming stressors in a transistor device. In accordance with the method, ions are implanted in a semiconductor substrate to introduce implant atoms within a lattice structure of the semiconductor substrate. The semiconductor substrate is annealed to form dislocation defects within the semiconductor substrate. Further, a transistor device is formed above a dielectric layer that is above the semiconducting substrate. The transistor device includes a channel region that is configured to provide a conductive channel between a source region and a drain region of the transistor device. The formation of the transistor device includes annealing the semiconductor substrate, which causes the dislocation defects to enlarge such that at least a portion of the dislocation defects abut a top surface of the semiconductor substrate. The dislocation defects are collectively oriented to impose a compressive strain on the channel region such that charge carrier mobility is enhanced in the channel region.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

To improve device performance in current CMOS (complementary metal-oxide-semiconductor) technologies, various stress techniques have been employed to increase the electron and hole mobility for n-channel and p-channel MOSFETs (metal-oxide-semiconductor field-effect transistors), respectively. One means of applying stressors to the channel between the source and drain of a transistor device is to implant defects within the semiconducting substrate of the device. For example, the defects can introduce dislocation loops, line dislocations or stacking faults within the substrate by applying a high dose, on the order of $1 \times 10^{15}$ ions/cm$^3$, of a semiconductor implant, such as silicon or germanium. Dislocation loops comprise a ring of atoms that do not conform to the lattice structure of the substrate, thereby imparting a stress in accordance with a dislocation plane in a particular direction that has x-, y- and z-components. In turn, stacking faults are essentially a linear stack of defect atoms that similarly impose a stress in a particular direction. Other defects that can be formed include three-dimensional screw dislocations. The density of the dislocation loops in the substrate can be controlled through the implant dose, where a higher implant dose results in a higher density of dislocation loops. In general, the dislocation loops are randomly oriented with respect to the channel. However, typically there is a preferred dislocation plane and the dislocation can impart either a compressive or tensile strain in the lattice. Compressive strain that is perpendicular to the current flow enhances electron mobility and NFET performance. In turn, dislocation loops that impart compressive strain parallel to the current flow do not affect electron mobility as long as the loops are not present in the active channel region. Similarly, compressive strain imparting dislocations oriented parallel to the current flow direction enhance the hole mobility, while dislocation loops that produce compressive strain perpendicular to the current flow do not affect hole mobility as long as the dislocation loops are not present in the active channel region. These strain effects are irrespective of the length of the gate or the gate pitch of the devices formed.

Figure 1:
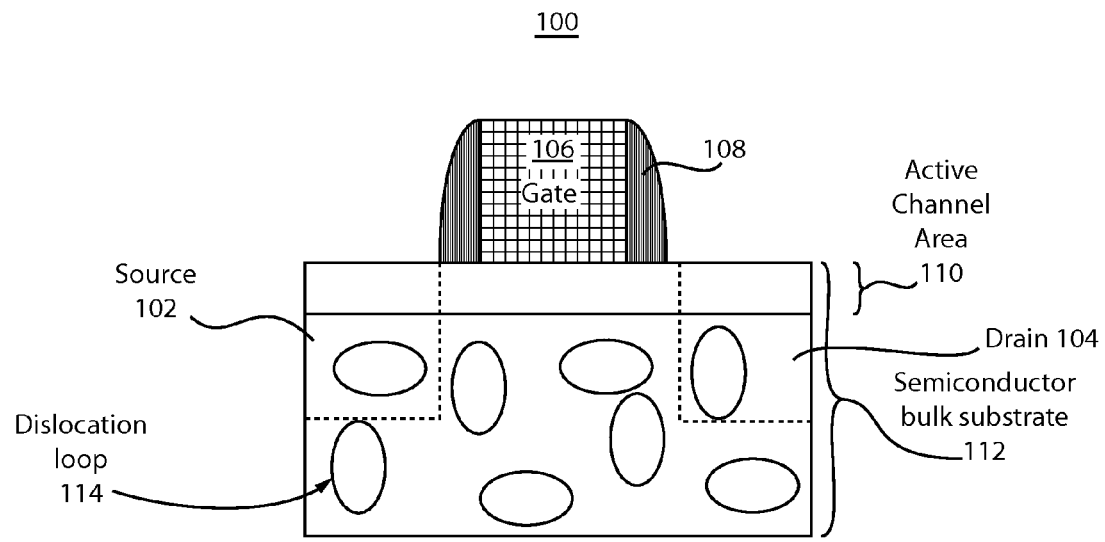
FIG. 1 is a cross-sectional view of an exemplary transistor device including dislocation loops in its substrate.

Referring now to the drawings in which like numerals represent the same or similar elements and initially to FIG. 1, an exemplary transistor device 100 in which dislocation loops 114 have been implanted is illustrated. The transistor device 100 is constructed on a bulk semiconductor substrate 112, such as silicon, and includes source 102 and drain 104 regions, a gate 106, gate spacers 108 and an active channel area 110. As noted above, the dislocation loops 114 can enhance charge carrier mobility unless they are within the active channel area 110. For example, for an NFET device, if the dislocation loop is in the channel area, lattice defect scattering mechanisms degrade the electron mobility. Thus, the implantation depth of the dislocation loops within the bulk semiconductor substrate should be controlled via the implantation energy to ensure that the dislocation loops do not form in the active channel area 110. However, a problem arises when annealing the substrate 112 during the fabrication of the device 100. In particular, the size of the dislocation loop expands as a result of annealing and the extent of the expansion is difficult to predict or to control. As such, thermal processing can cause the dislocation loops to grow into the active channel area, thereby reducing charge carrier mobility. To solve the problem, the dislocation loops can be implanted far from the top surface of the semiconductor substrate and their growth can be curbed by employing additional, suitable implants. However, implanting dislocation loops at increased depths can diminish the beneficial effects of the compressive strain imposed on the channel area by the defects. In accordance with exemplary embodiments of the present principles, dislocation loops and other defects can be implanted close to the semiconductor surface, while at the same time ensuring that they do not negatively affect charge carrier mobility. Indeed, the dislocation loops can be disposed directly at the surface in close proximity to the channel region and their growth as a result of annealing need not be controlled in any way by additional implants, thereby permitting a maximal imposition of compressive stress on the active channel area to enhance charge carrier mobility.

As will be appreciated by one skilled in the art, aspects of the present invention may be embodied as a system, method, device or apparatus. Aspects of the present invention are described below with reference to flowchart illustrations and/or block diagrams of methods, apparatus (systems) and devices according to embodiments of the invention. The flowchart and block diagrams in the Figures illustrate the architecture, functionality, and operation of possible implementations of systems, methods, devices and apparatuses according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

It is to be understood that the present invention will be described in terms of a given illustrative architecture having a substrate; however, other architectures, structures, substrate materials and process features and steps may be varied within the scope of the present invention.

It will also be understood that when an element described as a layer, region or substrate is referred to as being "on" or "over" another element, it can be directly on the other element or intervening elements may also be present. In contrast, when an element is referred to as being "directly on" or "directly over" another element, there are no intervening elements present. Similarly, it will also be understood that when an element described as a layer, region or substrate is referred to as being "beneath" or "below" another element, it can be directly beneath the other element or intervening elements may also be present. In contrast, when an element is referred to as being "directly beneath" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip including transistor devices of the present principles may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
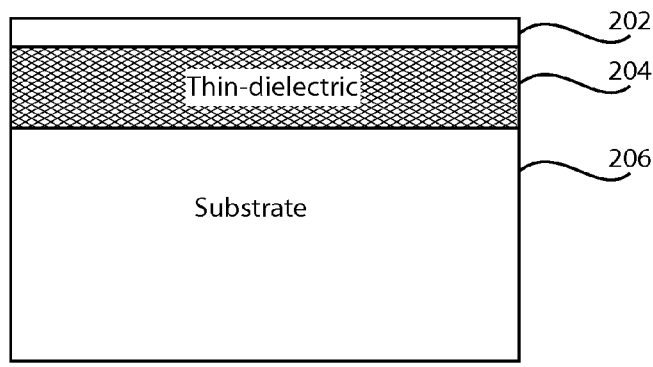
FIG. 2 is a cross-sectional view of a substrate on which dislocation defect formation processing can be conducted in accordance with one illustrative embodiment.

With reference now to FIG. 2, a substrate structure 200 that can be used in the fabrication of a transistor device in accordance with an exemplary embodiment is illustratively depicted. The substrate structure has a thin semiconducting layer 202, a thin dielectric layer 204 and a semiconductor substrate 206. The top semiconducting layer 202 can have a vertical thickness of about 3-10 nm, while the thin dielectric layer 204 can have a vertical thickness of 10-50 nm. Here, the substrate structure 200 can be implemented as an Ultra-thin Body and Buried Oxide (UTBB) substrate structure, where the layer 202 is an extremely thin silicon-on-insulator (ET-SOI) layer 202, the dielectric layer is a buried oxide (BOX) layer and the substrate 206 is a silicon or silicon-germanium substrate. UTBB is a viable substrate for fully depleted device architectures due to its superior short-channel control, its inherent, low device variability, the availability of multiple threshold voltage devices using substrate bias and its compatibility with current mainstream planar CMOS processing. UTBB should be an excellent candidate for meeting the competing features of density, power, performance and device variability in partially depleted SOI (PDSOI) or bulk MOSFETs that are scaled beyond the 20 nm node.

Figure 3:
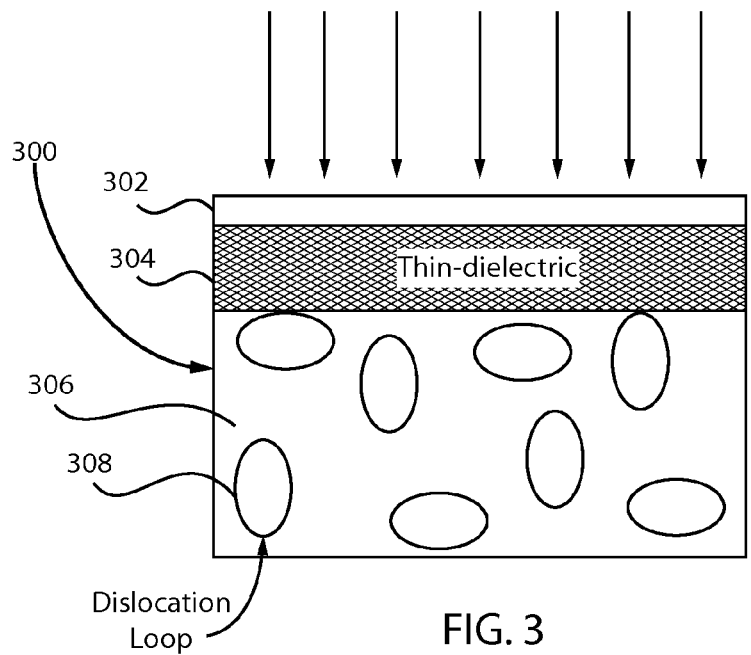
FIG. 3 is a cross-sectional view of an exemplary substrate including dislocation loops in accordance with one illustrative embodiment.
Figure 4:
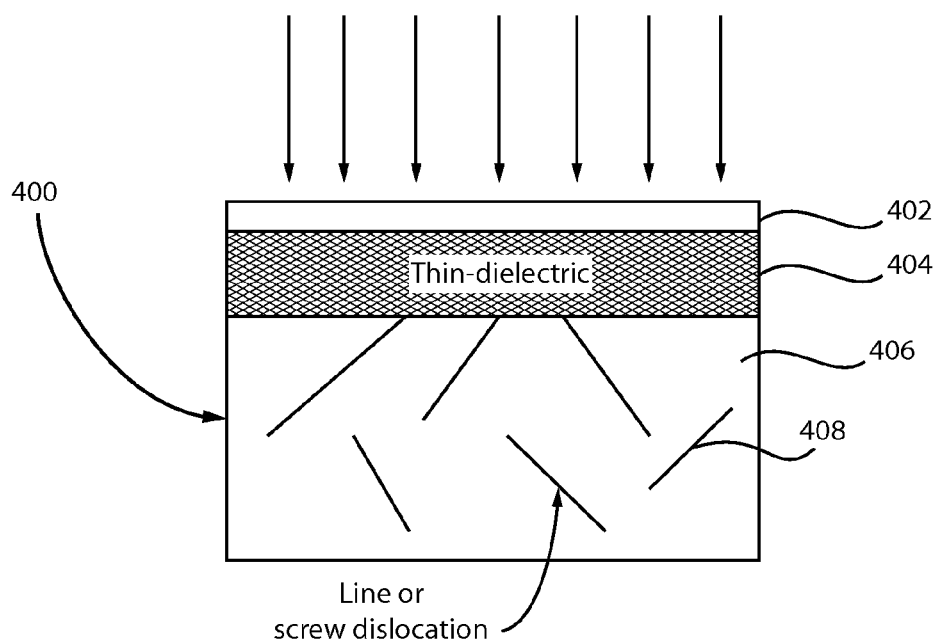
FIG. 4 is a cross-sectional view of an exemplary substrate including line or screw dislocations in accordance with one illustrative embodiment.

Referring to FIGS. 3 and 4, with continuing reference to FIG. 2, the implantation of defects within the substrate structure 200 in accordance with an exemplary embodiment is illustrated. In this embodiment, a dose of silicon ions at a concentration of between $5 \times 10^{14}$ and $8 \times 10^{15}$ ions/cm$^3$ are implanted into the substrate 206 through the layers 202 and 204 at an energy of between 8 and 30 keV for a BOX thickness of 10-50 nm. It should be noted that other implants and dielectric layers can be used. Examples of possible implants include germanium ions implanted with a dose concentration of between $5 \times 10^{14}$ and $8 \times 10^{15}$ ions/cm$^3$ and at an energy of between 20 and 70 keV. Other possible implant ions that can produce defects in the substrate include Xenon and Argon. Here, layers 302/402, 304/404 and 306/406 can correspond to layers 202, 204 and 206, respectively, after or during the implantation process. In accordance with one aspect, the substrate structures 300 and 400 can be thermally annealed to temperatures between 700 and 1050° C. to form dislocations. The dislocations can be two-dimensional dislocations, such as loop, line and/or stacking faults, and/or the dislocations can be three-dimensional dislocations, such as screw dislocations, or any combination thereof. In the particular embodiment illustrated in FIG. 3, dislocation loops 308 are formed, while in the embodiment illustrated in FIG. 4, line or screw dislocations 408 are represented. However, it should be understood that other dislocations can be formed. As shown in FIGS. 3 and 4, the implant depth is below the dielectric layers 304 and 404. The density and type of dislocation depends on the energy and dose of the implant and anneal condition. Typically there is a preferred dislocation plane and the dislocations can impart either compressive or tensile strain to the lattice, depending on the orientation of the dislocation plane. Isolated dislocations show a strong tendency to align along <110> directions, thus forming loops in silicon substrates.

Figure 5:
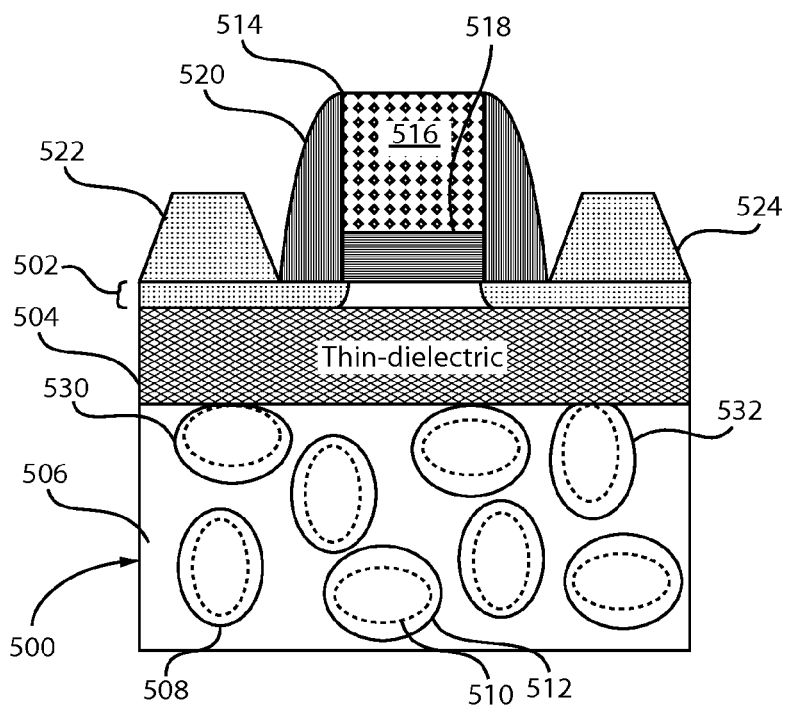
FIG. 5 is a cross-sectional view of an exemplary transistor device including dislocation loops in accordance with one illustrative embodiment.
Figure 6:
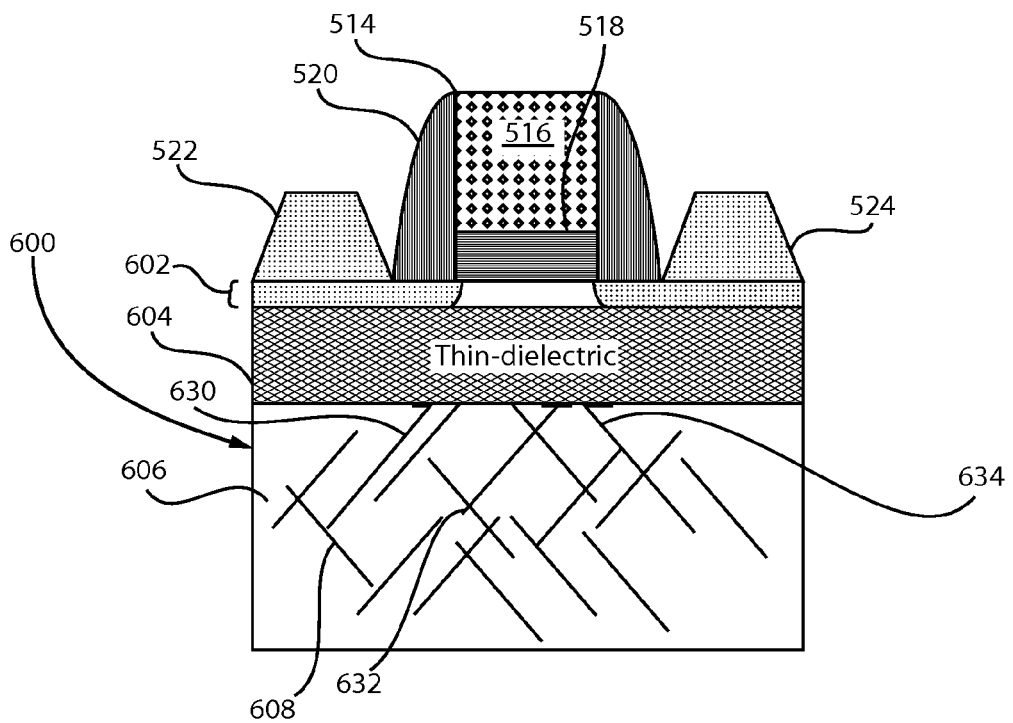
FIG. 6 is a cross-sectional view of an exemplary transistor device including line or screw dislocations in accordance with one illustrative embodiment.

Referring to FIGS. 5 and 6, with continuing reference to FIGS. 2-4, a transistor device can be fabricated on the substrate structures 300, 400. For example, typical CMOS processing can be performed to fabricate a gate structure 514, which includes a gate electrode 516, a gate dielectric layer 518 and gate spacers 520, and also raised source 522 and drain regions 524. The fabrication of the transistor devices 500 and 600 can involve thermal annealing to form electrical junctions. For example, thermal annealing can be performed to diffuse dopants from the source 522 and drain regions 524 to form the channel region 502/602 in the semiconducting material above the dielectric layer 504/604, which correspond to dielectric layers 304/404, respectively. In particular, as indicated above, the thermal annealing causes the dislocation loops 508 and the line or screw defects 608 to grow. For example, as illustrated in FIG. 5, the dislocation loops 508 can enlarge from a size 510 to that of 512. As indicated above, there is a direct relationship between the size of the dislocations and charge carrier mobility. While the dislocations can improve charge carrier mobility by imposing an appropriate stress on the active channel between the source and drain of a transistor device, physical encroachment of dislocations into the channel region can have a negative effect on the charge carrier mobility. Advantageously, the dielectric layer 504/604 protects the channel region 502/602 from encroachment by dislocations, as the dielectric layer blocks the growth of the dislocations during the thermal processing performed to fabricate the transistor device. As such, the dislocations can grow up to the top surface of the semiconductor layer 506/606, thereby enabling the imposition of maximal stress due to their proximity to the channel region 502/602. Accordingly, the proximity of the dislocations to the channel region enable a substantial improvement in charge carrier mobility, as the dislocations need not be implanted to substantial depths to avoid encroachment of dislocations into the channel region.

It should be noted that although the dislocation formation process has been described as being performed before the fabrication of the gate and the source and drain regions, the dislocations can be formed during the fabrication of the transistor device. For example, the dislocation formation process can be performed after the gate is formed and before the source and drain regions are formed.

Figure 7:
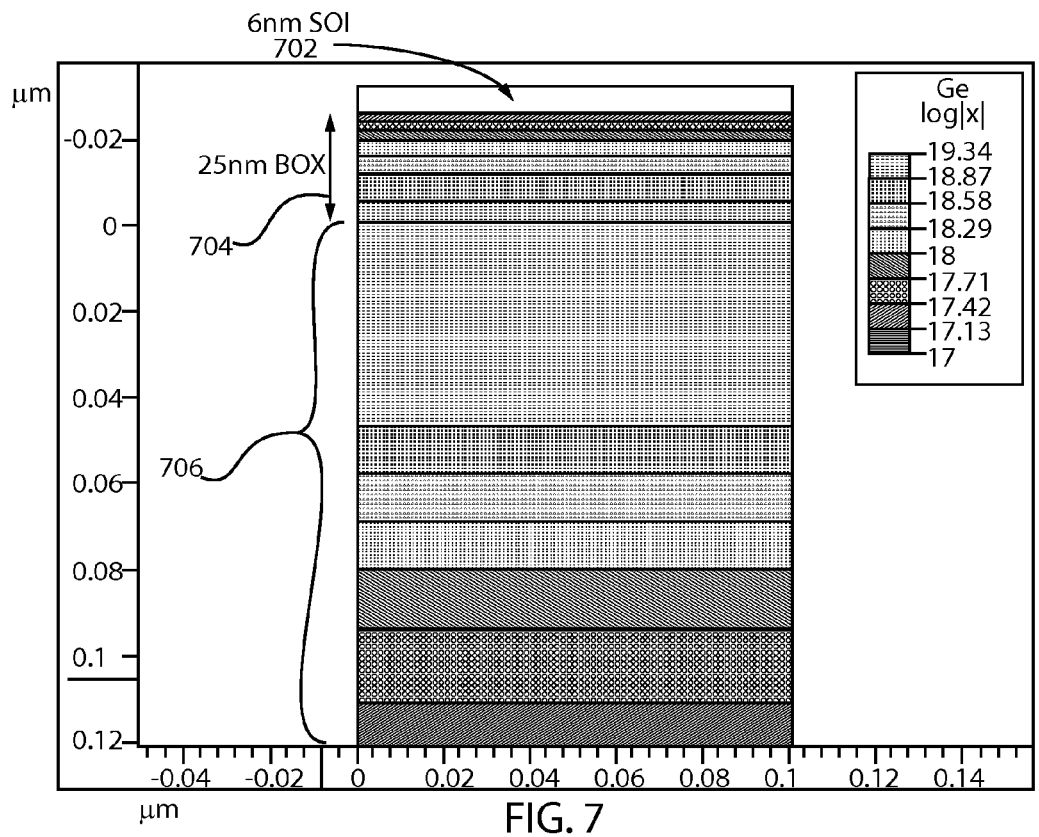
FIG. 7 is a diagram illustrating the concentration of defect-causing atoms in a substrate in accordance with one illustrative embodiment.
Figure 8:
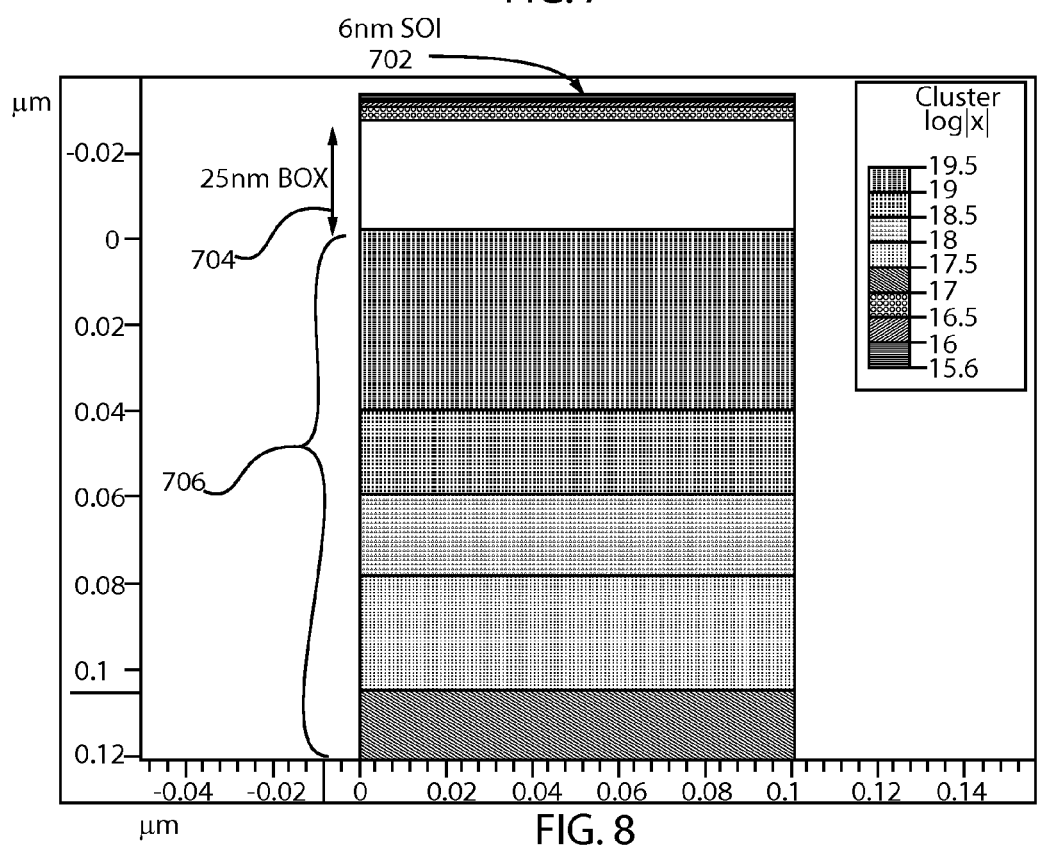
FIG. 8 is a diagram illustrating the concentration of clusters defect-causing atoms in a substrate in accordance with one illustrative embodiment.

FIGS. 7 and 8 illustratively depict the depth of dopants implanted and the clusters formed as a result of thermal processing during dislocation formation. The values in the legend in FIG. 7 are the log of the concentration of Ge implant atoms in units of atoms/cm$^3$. In addition, the values in the legend in FIG. 8 are the log of the concentration of implant Ge atoms that are in clusters in units of atoms/cm$^3$. Here, layers 702, 704 and 706 respectively correspond to layers 202, 204 and 206. The simulation results in FIGS. 7 and 8 show that the top layer 202 with a 6 nm depth can effectively be defect-free with a dielectric layer 704 that has a thickness of 25 nm. In this example, a BOX dielectric and a defect generation dose of $7 \times 10^{14}$ ions/cm$^3$ of germanium at an energy of 60 keV are employed. As illustrated in FIG. 7, lower than $1 \times 10^{17}$ ions/cm$^3$ of Ge remains in layer 702. Moreover, FIG. 8 shows a low cluster generation in the top-most layer 702, indicating that the defects are primarily within the semiconductor substrate 706. Further, FIGS. 7 and 8 also illustrate that the concentration of implant germanium atoms that are in clusters and form dislocation defects at the top surface of the semiconductor substrate 706 bordering the BOX layer 704 is $1 \times 10^{19}$ atoms/cm$^3$. This concentration of dislocation defects that are at or abut the surface of the semiconductor substrate is tunable and can be reduced to any value between $1 \times 10^{19}$ atoms/cm$^3$ and $1 \times 10^{17}$ ions/cm$^3$ by reducing the defect generation dose of the implant and/or the implant energy.

Figure 9:
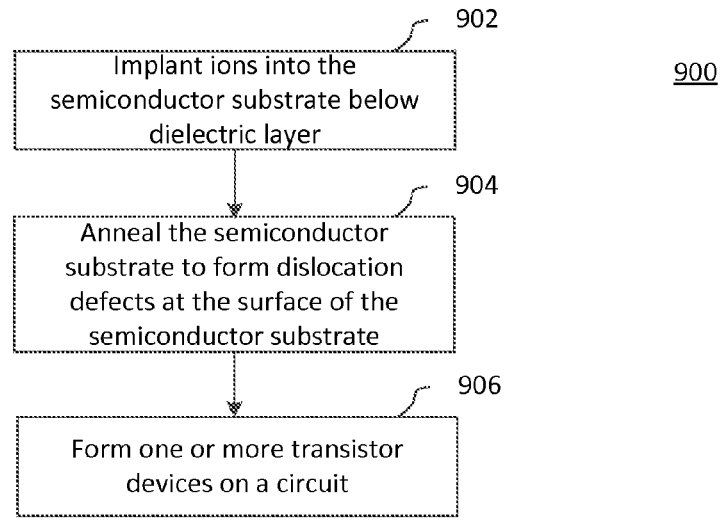
FIG. 9 is a high-level block/flow diagram of an exemplary method for forming stressors in one or more transistor devices in a circuit in accordance with one illustrative embodiment.

Referring now to FIG. 9, with continuing reference to FIGS. 2-6, an exemplary method 900 for forming stressors in one or more transistor devices on a circuit is illustratively depicted. It should be understood that the aspects of the present principles described above can be applied and incorporated into the method 900. The method 900 can begin at step 902, at which ions can be implanted into a semiconductor substrate below a dielectric layer to introduce implant atoms within a lattice structure of the semiconductor substrate. For example, as stated above, ions, such as silicon or germanium ions, can be implanted within the substrate 206. Here, the germanium ions can be implanted at a concentration of between $5\times10^{14}$ and $8\times10^{15}$ ions/cm$^3$ and at an energy of between 20 and 70 eV. These processing conditions can result in a concentration of implant atoms that compose defects in the semiconductor substrate that is at least $1\times10^{14}$ atoms/cm$^3$. Further, the concentration of implant atoms that are in clusters to compose dislocation defects in the semiconductor substrate, including the dislocation defects at the top surface is between $5\times10^{17}$ and $5\times10^{19}$ atoms/cm$^3$.

At step 904, the semiconductor substrate can be annealed to form dislocation defects at the surface of the semiconductor substrate. For example, the semiconductor substrate can be annealed at a temperature of between 700 and 1050° C. The dislocation defects formed, such as 308 and 408, are collectively oriented to impose a compressive strain on the channel region such that charge carrier mobility is enhanced in the channel region 502, 602 of the transistor device to be formed, as discussed above. For example, the dislocation defects formed can be collectively oriented to impose a compressive strain perpendicular to the current flow direction such that electron mobility is enhanced in the channel region of the transistor device to be formed. In accordance with these processing conditions, as noted above, the dislocation defects can comprise dislocation loops, line dislocations, stacking faults or screw dislocations, any combination thereof, and/or other defects. Further, at least a portion of the dislocation defects can abut a top surface of the semiconductor substrate. For example, as illustrated in FIGS. 3 and 4, defects 308, 408 can be formed at the top surface of the semiconductor substrate 306, 406. As noted above, the disposition of the dislocation defects at the top surface of the semiconductor substrate fosters a proximity to the channel regions 502, 602 that maximizes the beneficial effects on the charge carrier mobility due to the resulting compressive stress imposed on the channel regions.

At step 906, one or more transistor devices can be formed. For example, in accordance with one implementation, a gate structure 514, including a gate electrode 516, a gate dielectric layer 518 and spacers 520 can be formed in accordance with standard CMOS processing. The gate dielectric layer 518 can be a High-K Metal Gate (HKMG) layer. Further, source and drain regions can be formed. For example, raised source and drain regions 522 and 524, respectively, can be formed, recessed stress and drain regions can be formed to provide additional beneficial stresses to the channel region, or a combination of raised and recessed source and drains can be formed. Further, the source, drain and channel regions can be doped with a suitable doping process. The channel regions can have the same thickness as the layer 202 and can be between 3 and 10 nm. Step 906 can further include the formation of contacts, vias, metal lines, and/or inter-layer dielectrics, etc. as is known in the art, to complete the exemplary transistor device. In addition, the formation of the transistor device(s) can comprise annealing steps. For example, as noted above, dopants can be driven in the channel regions 502, 602 below the gate structure 514 by annealing the device. Annealing temperatures for device junction activation can range from 950 to 1100° C. followed by an optional high temperature millisecond laser anneal at 1200° C. Further, as discussed above, the annealing can cause the dislocation defects within the semiconductor substrate 506, 606 to enlarge. Here, the enlargement of the dislocation loops can cause additional dislocation loops to reach and abut the top surface of the semiconductor substrate 506, 606, thereby further enhancing charge carrier mobility in the channel region 502, 602. Furthermore, due to the growth of the dislocation defects as a result of the annealing at steps 904 or 906, the dislocation defects can deform at the top surface of the semiconductor substrate. For example, as illustrated in FIG. 5, the structure of the dislocation loops 530 and 532 are deformed as compared to other dislocation loops 508 in the body of the semiconductor substrate 506 that have a consistent loop structure. Similarly, as illustrated in FIG. 6, the structure of the line or screw dislocations 630-634 are deformed as compared to other dislocations 608 in the body of the semiconductor substrate 606 that have a consistent line or screw structure.

Figure 10:
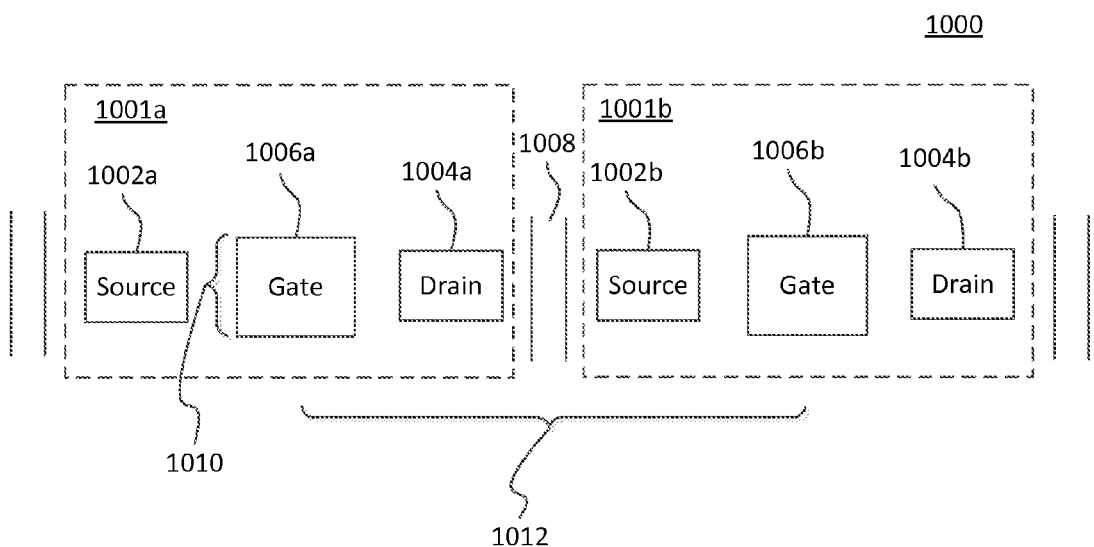
FIG. 10 is a high-level block diagram of a portion of a circuit in accordance with one illustrative embodiment.

It should be noted that although the present principles have been described with respect to the fabrication of a single transistor device, aspects described above can be employed to form a plurality of transistor devices on a circuit. For example, FIG. 10 illustrates a portion of an exemplary circuit 1000 that includes transistor devices 1001*a* and 1001*b*, which can be fabricated in accordance with the method 900 and can correspond to one or more of the transistor devices in FIGS. 5 and 6. Other elements of the transistor devices, such as contacts and metal lines are omitted for ease of understanding. Further, only two devices 1001*a* and 1001*b* are shown here for illustrative purposes. The transistor devices 1001*a* and 1001*b* include respective sources 1002*a*, 1002*b*, drains 1004*a*, 1004*b* and gates 1006*a*, 1006*b* and are separated by shallow trench isolators 1008. As indicated above, the compressive strain effects imposed on the channel between source and drain regions by dislocation defects are independent of the length 1010 of the gate or the gate pitch 1012 of the devices formed.

Having described preferred embodiments directed to the enhancement of charge carrier mobility in transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming stressors in a transistor device comprising:
   implanting ions in a semiconductor substrate to introduce implant atoms within a lattice structure of the semiconductor substrate;
   annealing the semiconductor substrate to form dislocation defects within the semiconductor substrate; and
   forming a transistor device above a dielectric layer that is above the semiconducting substrate, wherein the transistor device includes a channel region that is configured to provide a conductive channel between a source region and a drain region of the transistor device, and
   wherein the forming includes annealing the semiconductor substrate, which causes the dislocation defects to enlarge such that at least a portion of the dislocation defects abut a top surface of the semiconductor substrate, wherein the dislocation defects are collectively oriented to impose a compressive strain on the channel region such that charge carrier mobility is enhanced in the channel region.

2. The method of claim 1, wherein at least a portion of dislocation defects in a body of the substrate have a consistent structure and wherein said structure in the at least a portion of the dislocation defects at the top surface of the semiconductor substrate is deformed at the top surface as a result of said annealing of said forming.

3. The method of claim 1, wherein the dislocation defects include at least one of dislocation loops, line dislocations, stacking faults or screw dislocations.

4. The method of claim 1, wherein said implanting includes implanting the ions at a concentration of between $5 \times 10^{14}$ and $8 \times 10^{15}$ ions/cm$^3$.

5. The method of claim 1, wherein a concentration of implant atoms that are in clusters to compose dislocation defects in the semiconductor substrate, including the dislocation defects that abut the top surface, is at least $5 \times 10^{17}$ atoms/cm$^3$.

6. The method of claim 1, wherein said annealing the semiconductor substrate to form dislocation defects comprises annealing the semiconductor substrate at a temperature of between 700 and 1050° C.

* * * * *